United States Patent
De Brabander et al.

(10) Patent No.: US 8,404,132 B2
(45) Date of Patent: Mar. 26, 2013

(54) FORMING A MEMBRANE HAVING CURVED FEATURES

(75) Inventors: Gregory De Brabander, San Jose, CA (US); Mark Nepomnishy, San Jose, CA (US)

(73) Assignee: FUJIFILM Corporation, Tokyo (JP)

( * ) Notice: Subject to any disclaimer, the term of this patent is extended or adjusted under 35 U.S.C. 154(b) by 183 days.

(21) Appl. No.: 13/077,154

(22) Filed: Mar. 31, 2011

(65) Prior Publication Data

US 2012/0248063 A1    Oct. 4, 2012

(51) Int. Cl.
| | |
|---|---|
| B32B 37/02 | (2006.01) |
| B32B 38/10 | (2006.01) |
| B32B 37/06 | (2006.01) |
| B32B 37/14 | (2006.01) |
| C23F 1/00 | (2006.01) |

(52) U.S. Cl. .......................................... 216/27; 156/237
(58) Field of Classification Search .................. None
See application file for complete search history.

(56) References Cited

U.S. PATENT DOCUMENTS

| | | |
|---|---|---|
| 4,322,877 A | 4/1982 | Taylor |
| 6,937,736 B2 | 8/2005 | Toda |
| 7,204,586 B2 | 4/2007 | Hoisington et al. |
| 7,749,868 B2 | 7/2010 | Honda et al. |
| 2008/0020573 A1 | 1/2008 | Birkmeyer et al. |

OTHER PUBLICATIONS

Sami Franssila, "Introduction to Microfabrication," Jun. 14, 2004, Wiley, p. 198.

*Primary Examiner* — Allan Olsen
(74) *Attorney, Agent, or Firm* — Fish & Richardson P.C.

(57) ABSTRACT

Processes for making a membrane having a curved feature are disclosed. A profile-transferring substrate surface having a curved feature is created by vacuum bonding a membrane to a top surface of a substrate, where the top surface has a cavity formed therein. The surface of the membrane is exposed to a fluid pressure such that the membrane deforms and the undersurface of the membrane touches the bottom of the cavity. The curved feature formed in the deformed membrane can be made permanent by annealing the bonding areas between membrane and substrate. A uniform layer of material deposited over the exposed surface of the membrane will include a curved feature at the location where the membrane has bent into the cavity. After at least one layer of material has been uniformed deposited on the membrane, the cavity can be etched open from the bottom to remove the membrane from the underside.

23 Claims, 3 Drawing Sheets

FORMING A MEMBRANE HAVING CURVED FEATURES

TECHNICAL FIELD

This specification relates to fabrication of MEMS devices.

BACKGROUND

Many MEMS devices include piezoelectric actuators that deflect under applied electric voltages. Examples of such devices include fluid ejection systems that eject fluid in response to the actuation of a piezoelectric actuator connected to a fluid path. A printhead module in an ink jet printer is an example of a fluid ejection system. A printhead module typically has a line or an array of nozzles with a corresponding array of ink paths and associated actuators, and drop ejection from each nozzle can be independently controlled by one or more controllers.

A printhead module can include a semiconductor printhead die that is etched to define a fluid path that includes a pumping chamber. A piezoelectric actuator can be formed on one side of the pumping chamber and, in operation, can flex in response to a driving voltage signal to drive fluid along the ink path. The piezoelectric actuator includes a layer of piezoelectric material that changes geometry (i.e., actuates) in response to the driving voltage applied across the piezoelectric layer by a pair of opposing electrodes.

A piezoelectric element that is curved, such as a dome-shaped or dent-shaped piezoelectric membrane, can produce a larger displacement under a given driving voltage as compared to a flat piezoelectric element of similar lateral dimensions. Since the magnitude of the piezoelectric displacement affects the driving voltage that is required to eject fluid droplets of a desired drop volume, and hence, affects the power efficiency of the printhead module, piezoelectric actuators having curved piezoelectric membranes have been proposed. Various fabrication methods have been proposed to produce piezoelectric membranes that are curved or have curved features.

SUMMARY

This specification describes technologies related to MEMS fabrication processes for producing membranes having curved features.

When a thin layer of material is uniformly deposited on a profile-transferring substrate surface, the layer of material assumes surface features that conform to the profile of the profile-transferring substrate surface. To form a membrane having curved features (e.g., a piezoelectric membrane having an array of dents formed therein), a profile-transferring substrate surface having curved features (e.g., an array of dents) is first prepared. To prepare the profile-transferring substrate surface, first, cavities (e.g., flat-bottomed recesses) are formed in a planar surface of a semiconductor substrate at locations where the curved features are desired. Then, a membrane is bonded to the surface of the substrate in a vacuum, such that the cavities are vacuum sealed by the membrane. Then, the surface of the membrane is exposed to a fluid pressure (e.g., atmospheric pressure), such that the membrane deforms (e.g., bends) at the sites of the cavities and the undersurface of the membrane touches (e.g., presses against) the bottom surface of each cavity in a contact area smaller than the entire bottom surface of the cavity. At this point, the exposed surface of the membrane can serve as a profile-transferring substrate surface, and a uniform layer of material deposited over the exposed surface of the membrane will include curved features at locations where the membrane has bent into the cavities.

In some implementations, if subsequent processing steps are to be performed in vacuum, the curved features formed in the deformed membrane can be made permanent by annealing the contact areas between the undersurface of the membrane and the bottom surfaces of the cavities in the substrate. When the bonding between the deformed membrane and the substrate within the sidewalls of the cavities becomes permanent, the curved features of the deformed membrane will remain even if the fluid pressure (e.g., atmospheric pressure) is removed or reduced (e.g., if subsequent processing steps to deposit additional layers of material over the curved features of the membrane are performed in a vacuum or low pressure environment).

In some implementations, after at least one layer of material (e.g., a bottom electrode layer of a piezoelectric actuator assembly) has been uniformed deposited on the top surface of the membrane, the cavities can be etched open from the bottom side of the substrate, and the membrane can be removed (e.g., etched) from the underside to expose the undersurface of the layer of material that was deposited on the top surface of the membrane. Additional layers of materials (e.g., a piezoelectric layer and a top electrode layer of the piezoelectric actuator assembly) can be sequentially deposited over the at least one layer of material, either before or after the removal of the membrane. Each of the sequentially deposited layers is also curved toward the substrate at the locations of the cavities.

In general, in one aspect, a process for making a membrane having curved features includes the actions of: vacuum bonding a first surface of a first substrate to a first surface of a first membrane layer, the first surface of the first substrate having a plurality of cavities formed therein, the first membrane layer being an exposed layer of a second substrate, a second surface of the first membrane layer being attached to a handle layer of the second substrate, and the first surface of the first membrane layer seals the plurality of cavities to form a plurality of vacuum chambers at completion of the vacuum bonding; removing the handle layer of the second substrate to expose the second surface of the first membrane layer; exposing the second surface of the first membrane layer to a fluid pressure such that the first membrane layer bends in areas above the plurality of cavities and touches respective bottom surfaces of the plurality of cavities at a plurality of respective contact locations; and annealing the first membrane layer and the first substrate to form permanent bonds between the first membrane layer and the first substrate at the plurality of respective contact locations.

In some implementations, the process further include: depositing a second membrane layer over the second surface of the first membrane layer, such that the second membrane layer conforms to the second surface of the first membrane layer and includes a plurality of curved portions in the areas above the plurality of cavities.

In some implementations, the second membrane layer includes multiple sub-layers, and depositing the second membrane layer comprises sequentially depositing each of the multiple sub-layers over the second surface of the first membrane layer.

In some implementations, the sub-layers include at least a reference electrode layer, a sputtered piezoelectric layer, and a drive electrode layer.

In some implementations, the depositing is performed after the annealing.

In some implementations, the process further include: after the second membrane layer is deposited, removing the bottom surfaces of the plurality of cavities to open the plurality of vacuum chambers and expose the first surface of the first membrane layer in areas within respective sidewalls of the plurality of cavities.

In some implementations, removing the bottom surfaces of the plurality of cavities further includes: etching a second surface of the first substrate in at least the areas within the respective sidewalls of the plurality of cavities such that the plurality of vacuum chambers are opened and that the first surface of the first membrane layer are exposed in the areas within the respective sidewalls of the plurality of cavities, where exposed first surface of the first membrane layer serves as an etch stop for the etching.

In some implementations, the process further includes: removing the first membrane layer in the areas within the sidewalls of the plurality of cavities to expose the curved portions of the second membrane layer, while the curved portions of the second membrane layer remain curved during and after the removal of the first membrane layer.

In some implementations, removing the first membrane layer in the areas within the respective sidewalls of the plurality of cavities further includes: etching the first membrane layer in the areas within the respective sidewalls of the plurality of cavities to expose the curved portions of the second membrane layer, where the exposed curved portions of the second membrane layer serves as an etch stop and the first substrate serves as a mask for the etching.

In some implementations, the process further includes: selectively etching the first surface of the first substrate through a patterned photoresist layer to form the plurality of cavities, the patterned photoresist layer defining respective lateral dimensions and locations of the plurality of cavities; and removing the patterned photoresist layer from the first surface of the first substrate after the plurality of cavities reach a predetermined depth.

In some implementations, the selective etching is dry etching.

In some implementations, the respective bottom surfaces of the plurality of cavities are sufficiently smooth to enable bonding with another substrate.

In some implementations, vacuum bonding the first surface of the first substrate to the first surface of the first membrane layer further includes: forming a oxide or nitride layer on a silicon substrate; and bonding an exposed surface of the oxide or nitride layer to the first surface of the first substrate in a vacuum environment.

In some implementations, the process further includes forming the plurality of cavities in the first surface of the first substrate.

In some implementations, exposing the second surface of the first membrane layer to a fluid pressure includes: exposing the second surface of the first membrane layer to an atmosphere pressure.

In some implementations, the plurality of cavities have a depth of 5-15 microns.

In some implementations, the plurality of cavities have respective lateral dimensions of 150-200 microns.

In some implementations, the first membrane layer has a thickness of 1-2 microns.

In general, in another aspect, a process for making a membrane having a curved feature includes the actions of: vacuum bonding a first surface of a first substrate to a first surface of a first membrane layer, the first surface of the first substrate having a cavity formed therein, the first membrane layer being an exposed layer of a second substrate, a second surface of the first membrane layer being attached to a handle layer of the second substrate, and the first surface of the first membrane layer seals the cavity to form a vacuum chamber at completion of the vacuum bonding; removing the handle layer of the second substrate to expose the second surface of the first membrane layer; exposing the second surface of the first membrane layer to a fluid pressure such that the first membrane layer bends in an area above the cavity and touches a bottom surface of the cavity at a contact location; annealing the first membrane layer and the first substrate to form a permanent bond between the first membrane layer and the first substrate at the contact location; depositing a second membrane layer over the second surface of the first membrane layer, such that the second membrane layer conforms to the second surface of the first membrane layer and includes a curved portion in the area above the cavity; and after the second membrane layer is deposited, removing the bottom surface of the cavity to open the vacuum chamber and expose the first surface of the first membrane layer in an area within sidewalls of the cavity.

In general, in another aspect, a process for making a membrane having a curved feature includes the actions of: vacuum bonding a first surface of a first substrate to a first surface of a first membrane layer, the first surface of the first substrate including a cavity formed therein; the first membrane layer being an exposed layer of a second substrate, a second surface of the first membrane layer being attached to a handle layer of the second substrate, and the first surface of the first membrane layer seals the cavity to form a vacuum chamber at completion of the vacuum bonding; removing the handle layer of the second substrate to expose the second surface of the first membrane layer; exposing the second surface of the first membrane layer to a fluid pressure such that the first membrane layer bends in an area above the cavity; depositing a second membrane layer over the second surface of the first membrane layer while the second surface of the first membrane layer is exposed to the fluid pressure, such that the second membrane layer conforms to the second surface of the first membrane layer and includes a curved portion in the area above the cavity; and after the second membrane layer is deposited, removing the bottom surface of the cavity to open the vacuum chamber and expose the first surface of the first membrane layer in an area within sidewalls of the cavity.

In some implementations, removing the bottom surface of the cavity further includes: etching a second surface of the first substrate in at least the area within the sidewalls of the cavity such that the vacuum chamber is opened and that the first surface of the first membrane layer is exposed in the area within the sidewalls of the cavity, where exposed first surface of the first membrane layer serves as an etch stop for the etching.

In some implementations, the process further includes: removing the first membrane layer in the area within the sidewalls of the cavity to expose the curved portion of the second membrane layer, while the curved portion of the second membrane layer remains curved during and after the removal of the first membrane layer.

In some implementations, removing the first membrane layer in the area within the sidewalls of the plurality of cavities further includes: etching the first membrane layer in the area within the sidewalls of the cavity to expose the curved portion of the second membrane layer, where the exposed curved portion of the second membrane layer serves as an etch stop and the first substrate serves as a mask for the etching.

Particular implementations of the subject matter described in this specification can be implemented to realize one or more of the following advantages.

A profile-transferring substrate surface having curved features can be formed via a series of MEMS fabrication processes. The sizes, shapes, and locations of the curved features formed in the profile-transferring substrate surface are uniform and controllable. In addition, the densities of the curved features in a profile-transferring substrate surface can be higher than those achievable by injection molding or mechanical means. By using the profile-transferring substrate surface produced according to the methods disclosed in this specification, membranes of various materials can be formed over the profile-transferring substrate surface, where each membrane also assumes curved features conforming to those existing in the profile-transferring substrate surface, and the curved features in the membranes also have well controlled sizes, shapes, locations, and high densities.

In addition, the membrane providing the profile-transferring substrate surface can be subsequently removed without affecting the curved features already formed in the layers of materials deposited over the membrane prior to its removal. The grain structures of a membrane formed by material deposition on the profile-transferring substrate surface, such as a piezoelectric membrane deposited by sputtering, can be more uniform in size, shape, and distribution, and more uniformly aligned than those achievable by injection molding or mechanical means. The more uniform and aligned grain structures can help improve the lifetime of the membrane during repeated actuations.

The processes described in this specification can be used to form a durable, highly efficient, compact, and high resolution integrated piezoelectric actuator assembly or piezoelectric transducer array that include curved piezoelectric elements.

The details of one or more implementations of the subject matter described in this specification are set forth in the accompanying drawings and the description below. Other features, aspects, and advantages of the subject matter will become apparent from the description, the drawings, and the claims.

BRIEF DESCRIPTION OF THE DRAWINGS

Many of the layers and features are exaggerated to better show the process steps and results. Like reference numbers and designations in the various drawings indicate like elements.

DETAILED DESCRIPTION

Figure 1A:
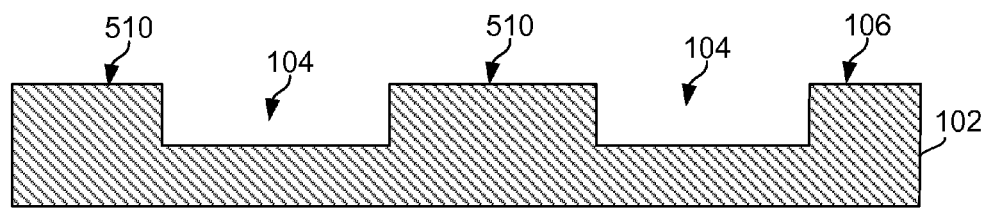
FIGS. 1A-1G illustrate an example process for forming a membrane having curved features.

Fluid droplet ejection can be implemented with a printhead module which includes a die fabricated using MEMS processing techniques. The printhead die includes a substrate in which a plurality of microfabricated fluid flow paths are formed, and a plurality of actuators on the substrate to cause fluid to be selectively ejected from nozzles connected to the flow paths. Each flow path with its associated actuator provides an individually controllable MEMS fluid ejector unit and the plurality of actuators form an actuator assembly.

A MEMS actuator having a curved piezoelectric membrane can be formed using a profile-transferring substrate having a curved surface feature (e.g., a concave recess or dent in a planar substrate surface). Accordingly, an actuator assembly having an actuator array can be formed using a profile-transferring substrate surface having an array of curved surface features (e.g., an array of concave recesses or dents in a planar substrate surface). The piezoelectric material used for the piezoelectric actuator is deposited (e.g., sputtered) over at least the curved portions of the profile-transferring substrate surface before the profile-transferring substrate is removed from below the curved piezoelectric membrane. Without being limited to any particular theories, the resulting curved piezoelectric membrane can includes grain structures that are columnar and aligned in both the curved portions and any planar portions surrounding the curved portions, and all or substantially all of the columnar grains are locally perpendicular to the surface of the piezoelectric membrane.

Different processes may be used to form curved features on a profile transferring substrate surface. As described in this specification, a membrane is used to provide a profile-transferring substrate surface having curved features. When a thin layer of material is uniformly deposited on the profile-transferring substrate surface, the thin layer of material adopts surface features that conform to the profile of the profile-transferring substrate surface. Thus, the thin layer of material forms a new membrane that has curved features conforming to the curved features of the profile-transferring substrate surface.

The membrane providing the profile-transferring substrate surface can be subsequently removed from under the new membrane within at least the curved portions of the new membrane, leaving the curved features of the new membrane suspended and free to deflect. The first thin layer of material that is deposited over the profile-transferring substrate surface can be a bottom electrode layer of a piezoelectric actuator assembly. Additional layers of materials (e.g., the piezoelectric layer and the top electrode layer) can be sequentially deposited over the first thin layer of material, each adopting curved surface features conforming to the curved features of the layer immediately below.

FIG. 1A-1G illustrate an example process for providing a curved profile-transferring substrate surface using a first membrane, and forming a second membrane having curved features based on the curved profile-transferring substrate surface.

First, a profile-transferring substrate surface having curved surface features are created using a first membrane. As shown in FIG. 1A, a substrate 102 having a plurality of cavities 104 is prepared. The substrate 102 can be a semiconductor substrate, such as a silicon substrate, having a planar top surface 106. The plurality of cavities 104 are formed in the planar top surface 106 of the substrate 102, for example, by etching. For example, an anisotropic etching (e.g., plasma dry etching) can be used to create flat bottomed recesses that have straight sidewalls.

The respective locations, sizes, and shapes of the cavities are pre-determined based on the respective locations, sizes, and shapes of the curved features (e.g., dents) that are desired for the profile-transferring substrate surface, and ultimately for the one or more layers of materials subsequently deposited over the profile-transferring substrate surface.

For example, if a piezoelectric layer having a rectangular array of curved features formed therein is desired, a profile-transferring substrate surface having a rectangular array of curved features is needed, and hence, a rectangular array of cavities should be formed in the top surface 106 of the substrate 102. Similarly, if a piezoelectric layer having a parallelogram array of curved features formed therein is desired, a parallelogram array of cavities should be formed in the top surface 106 of the substrate 102. Other overall shapes of the array of curved features are possible. The locations of individual cavities in the array are determined based on locations of individual curved features in the array in a similar manner.

In addition to the overall shape and individual locations of the array of cavities, the shape of a cavity's opening in the top surface 106 of the substrate 102 is determined based on the desired lateral shape of an individual curved feature. Therefore, if a circular dent is desired in a piezoelectric membrane, the opening of the cavity should also be circular. Similarly, if a square dent with curved sidewalls is desired in a piezoelectric membrane, the opening of the cavity should be square; and so on. The lateral dimensions (e.g., the radius of a cylindrical cavity) of the cavity opening should be roughly equal to the lateral dimensions of the curved feature (e.g., the radius of a circular dent) that is desired in a layer to be deposited above the profile-transferring substrate surface. Adjustments to the lateral dimensions of the cavity opening can be made to accommodate the variations created due to the thickness of the different layers that is formed over the cavity opening.

The aspect ratio of each cavity (e.g., a ratio between a lateral dimension of the cavity and a depth of the cavity) should be determined according to a desired depth and lateral dimension of the curved feature (e.g., dents) to be formed in a membrane (e.g., a conductive membrane to be deposited over the profile-transferring substrate surface). More details on the aspect ratio and the depth of the cavity are described later in the specification with respect to FIG. 1D.

In an example process to form the cavities 104 in the top surface 106 of the substrate 102, a photoresist layer can be deposited on the top surface 106. The photoresist layer is patterned to define the locations, and lateral shapes and sizes of the cavity openings. The top surface 106 is then exposed to an etchant in a dry etching or wet etching process, such that the cavities 104 are formed in the substrate surface 106 through the patterned photoresist. In some implementations, the etching is anisotropic process, where the cavities formed in the top surface 106 of the substrate 102 has straight sidewalls, and flat bottom surfaces, as shown in FIG. 1A. In this example, straight walled recesses have been created. However, in some implementations, the resulting cavities may have tapered sidewalls that converge onto a flat bottom. After the cavities 104 reach a predetermined depth into the substrate 102, the etching can be stopped. Alternatively, the substrate 102 can include a buried etch stop layer, and etching can occur until the etch stop layer is exposed. The photoresist can be stripped away to re-expose the top surface 106 of the substrate 102, which now has the plurality of cavities 104 formed therein.

In some implementations, the top surface 106 of the substrate 102 is further processed such that it is smooth enough to be subsequently bonded with another substrate surface. If the resulting surface after the cavity formation is sufficiently smooth, no additional processing to further smooth it is necessary.

After the plurality of cavities 104 are formed in the first surface 106 of the substrate 102, a first membrane is vacuum bonded to the top surface 106 of the substrate 102, such that the bottom surface of the first membrane seals the cavities 104 in the top surface 106 of the substrate 102 to form a plurality of vacuum chambers. The top surface of the first membrane will serve to provide the profile-transferring substrate surface with curved surface features, after the curved surface features are created in the first membrane.

Figure 1B:
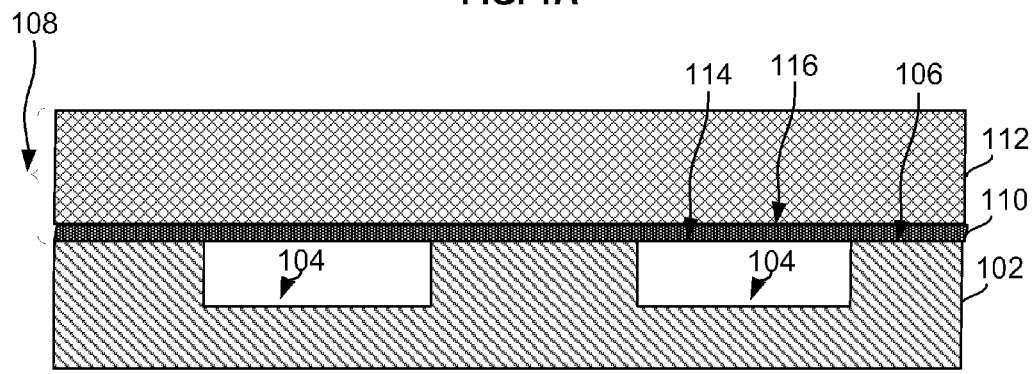

In some implementations, as shown in FIG. 1B, a substrate 108 having a membrane layer 110 and a handle layer 112 attached to the membrane layer 110 can be vacuum bonded to the top surface 106 of the substrate 102. For example, the bottom surface 114 of the membrane layer 110 can be bonded to the top surface 106 of the substrate 102 by adhesion bonding in a vacuum environment. Alternatively, the bottom surface 114 of the membrane layer 110 can be pressed against the top surface 106 of the substrate 102 in a vacuum environment to form a temporary bond. Then, the entire structure is annealed to form a permanent bond between the bottom surface 114 of the membrane layer 110 and the top surface 106 of the substrate 102 in areas that the two surfaces are touching. After vacuum bonding, the cavities 104 are vacuum sealed by the bottom surface 114 of the membrane layer 110.

Figure 1C:
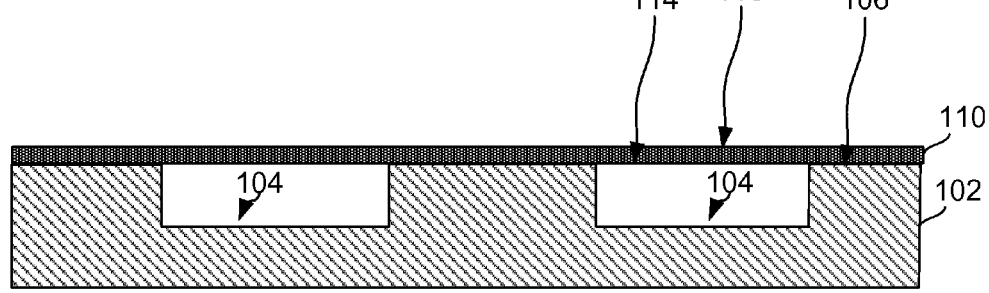

After the bottom surface 114 of the membrane layer 110 is vacuum bonded to the top surface 106 of the substrate 102, the handle layer 112 of the substrate 108 can be removed to expose the top surface 116 of the membrane layer 110. Various methods, such as grinding, polishing, and etching, can be used to remove the handle layer 112. FIG. 1C shows the structure after the handle layer 112 of the substrate 108 has been removed exposing the top surface 116 of the membrane layer 110.

In some implementations, the substrate 108 can be formed by coating a silicon substrate with an oxide (e.g., $SiO_2$) or nitride (e.g., $SiN_2$) deposition process. Alternatively, the oxide or nitride layer can be grown by exposing the silicon substrate to an oxygen or nitrogen environment. The resulting oxide or nitride layer from either process can serve as the membrane layer 110, and the rest of the substrate below the oxide or nitride layer can serve as the handle layer 112.

The thickness of the membrane layer 110 is selected such that it is thin enough to flex and touch the bottom surface of the cavities 104 under a fluid pressure (e.g., atmospheric pressure, liquid pressure, or gas pressure) without breaking. In some implementations, the membrane layer 110 is approximately 1-2 microns (e.g., 1 micron or 2 micron) thick, for a cavity with a cavity opening of 100-300 microns (e.g., 170 microns) wide and 5-15 microns (e.g., 10 microns) deep. The thickness of handle layer 112 can be a few hundred microns, such as 200 microns-600 microns.

Figure 1D:
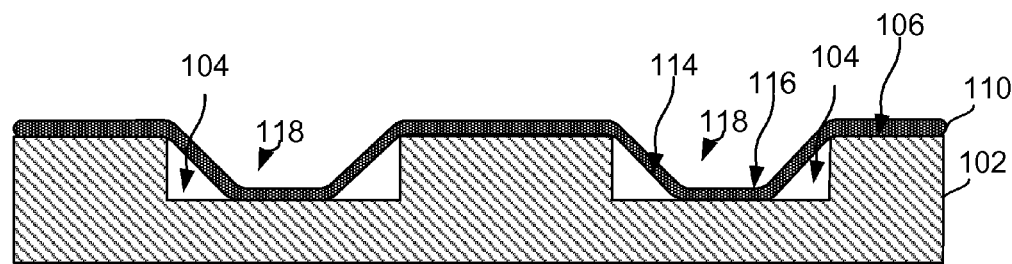

FIG. 1D shows the membrane layer 110 bending into the plurality of cavities when the top surface 116 of the membrane layer 110 is exposed to a fluid pressure (e.g., atmospheric pressure), for example, after the substrate 102 with the vacuum bonded membrane 110 is removed from the vacuum environment. In some implementations, if the amount of bending the membrane layer 110 exhibits is not sufficient to allow the bottom surface 114 of the membrane layer 110 to touch the bottom surfaces of the cavities 104 and form a sufficiently large contacting area, the external fluid pressure can be increased slightly to further press the membrane 110 into the cavities.

The extent that the membrane layer 110 can be pushed into the cavities 104 also depends on the size and shape of the cavity opening, as well as the depth of the cavity 104. The material property (e.g., flexibility and compliance) of the membrane layer 110 and the thickness of the membrane layer 110 also affects how much the membrane layer 110 can be pushed into the cavities 104 and against the bottom surface of the cavities 104.

When the membrane layer 110 is pushed by external fluid pressure against the bottom surface of the cavities 104, each curved feature 118 (e.g., dent) that is formed in the membrane layer 110 at the locations of the cavities 104 has a flat portion at the center, and the flat portion is smaller than the overall lateral size of the curved feature 118. In other words, each curved feature 118 includes a side surface that gradually converges from a wide opening toward a smaller flat bottom, as shown in FIG. 1D.

In some implementations, the structure shown in FIG. 1D can be used as a profile-transferring substrate to form subsequent layers of materials having curved features (e.g., dents) that conform to the top surface 116 of the membrane layer 110. However, before a permanent bond is formed between the bottom surface 114 of the membrane layer 110 and the bottom surfaces of the cavities 104 at the contact locations of the two surfaces, the membrane layer 110 will restore to its original flat shape if the subsequent processing steps are to be performed in vacuum.

Therefore, in some implementations, the structure shown in FIG. 1D is annealed at a high temperature, while the top surface 116 of the membrane layer 110 is exposed to the fluid pressure (e.g., atmospheric pressure) and while the bottom surface 114 of the membrane layer 110 is in pressed against the bottom surfaces of the cavities 104 at their respective contact locations. When the bonding between the bottom surface 114 of the membrane layer 110 and the bottom surfaces of the cavities 104 are made permanent through annealing, the curved features 118 formed in the membrane layer 110 will remain even if subsequent process steps are performed in a low pressure or vacuum environment. The top surface 116 of the membrane layer 110 can then serve as a profile-transferring substrate surface on which subsequent one or more layers of materials can be uniformly deposited, and the subsequent layers of materials will include curved features (e.g., dents) that conform to the curved features formed in the profile-transferring substrate surface.

Figure 1E:
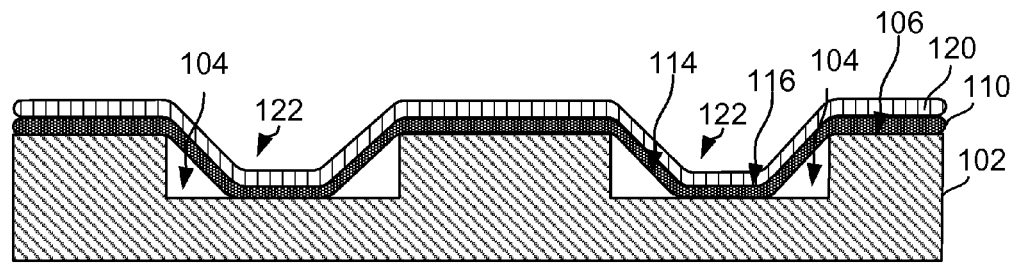

As shown in FIG. 1E, a layer of conductive material 120 (e.g., a few thousands of Angstroms of Au, Au/W, Ir, or Pt, and so on), is deposited on the exposed top surface 116 of the membrane layer 110. The layer of conductive material 120 is of uniform thickness and can serve as a bottom electrode layer of a piezoelectric actuator assembly. The layer of conductive material 120 includes curved portions 122 that conform to the profile-transferring substrate surface provided by top surface 116 of the membrane 110. The layer of conductive material 120 also optionally includes planar portions surrounding curved portions 122.

Additional layers of materials (not shown in FIG. 1E) can be deposited over the first layer of material 120, such as a piezoelectric layer, and a top electrode layer. Various suitable methods for depositing the one or more layers of materials can be used. For example, the bottom electrode layer, the piezoelectric layer, and the top electrode layer can each be deposited by sputtering, plasma-enhanced vapor deposition, chemical vapor deposition, or physical vapor deposition, and so on. The different layers of materials can each be patterned before the next layer of material is deposited over it. The different layers can form the piezoelectric actuator assembly of a fluid ejection module or other MEMS devices, such as ultrasound transducers.

Figure 1F:
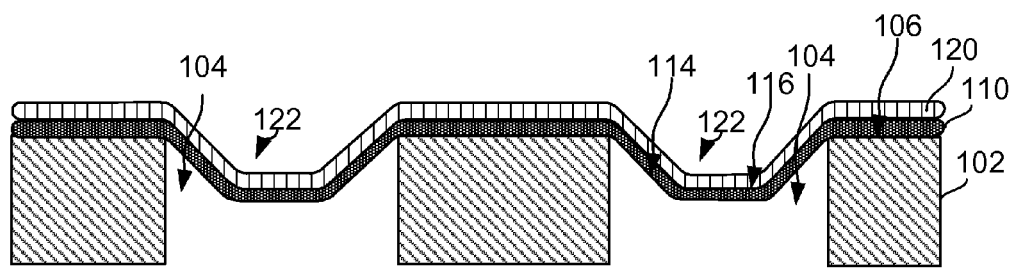

In some implementations, the membrane layer 110 or at least a portion of it can be removed from the backside within the sidewalls of the cavities 104, after at least a first layer of material (e.g., the first layer of material 120) has been deposited over the top surface 116 of the membrane layer 110. In some implementations, more layers are deposited before the membrane layer 120 is removed within the cavities 104. As shown in FIG. 1F, first, material is removed from the backside of the substrate 102, for example, by grinding, polishing, or etching, until the bottom surfaces of the cavities 104 are removed and the cavities 104 are open from the bottom side. The bottom surface 114 of the membrane layer 110 is now exposed in areas within the sidewalls of the cavities 104.

Without being limited to any particular theory, the curved portions of the membrane layer 110 and the curved portions of the layers deposited above the membrane layer 110 remain curved even after the permanent bonding between the membrane layer 110 and the bottom surface of the cavities no longer exist. The curved features in the membrane layer 110 and in the additional layers deposited over the membrane layer 110 will remain regardless of whether subsequent processing occurs in a vacuum or non-vacuum environment.

After the cavities 104 are opened from the bottom side, and the bottom surface 114 of the membrane layer 110 is exposed in the areas within the sidewalls of the cavities 104, material can be removed from the bottom surface 114 of the membrane layer 110 to expose the bottom surface of the first layer of material 120 that is deposited over the top surface 116 of the membrane layer 110. In some implementations, the material of the membrane layer 110 can be removed by anisotropic etching, with the substrate 102 and the bottom-side opening of the cavities 104 as a mask.

Figure 1G:
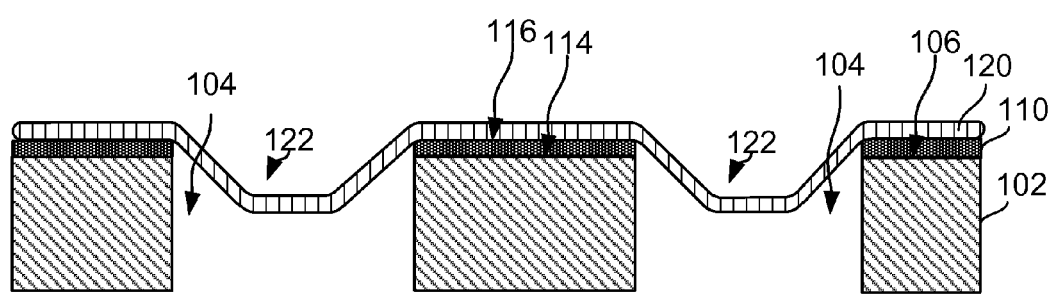

FIG. 1G shows the resulting structure after the membrane layer 110 has been completely etched away within the sidewalls of the cavities 104, and the bottom surface of first layer of material 120 has been exposed within the sidewalls of the cavities 104. Planar portions of membrane layer 110 remain in areas outside the sidewalls of the cavities 104, above the substrate 102 and below the planar portions of the first layer of material 120 deposited on the membrane layer 110. In some implementations, a thin layer of the membrane layer 110 can remain and serve as a protective layer for the first layer of material 120 deposited over the membrane layer 110 in subsequently processing steps. In some implementations, the entire membrane layer 110 can remain under the first layer of material 120 deposited over the membrane layer 110.

Figure 2:
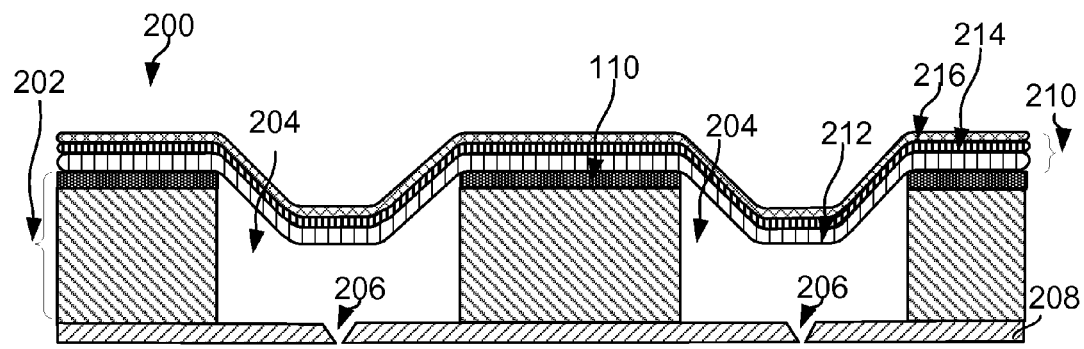
FIG. 2 is a schematic cross-sectional view of a printhead die in an example fluid ejection module having a concave piezoelectric actuator.

FIG. 2 is a schematic of an example fluid ejection system 200 that can be formed at least in part using the process shown in FIG. 1A-1G. As shown in FIG. 2, the remaining membrane layer 110 in conjunction with the substrate 102 having the cavities 104 formed therein, can serve as a pumping chamber layer 202 of the fluid ejection system 200, and the cavities 104 can serve as the pumping chamber cavities 204 for the fluid ejection system 200. The pumping chamber cavities 204 are connected to fluid paths that have been formed in the pumping chamber layer 202 in a different process. Nozzles 206 are formed in a nozzle layer 208, and are connected to the pumping chamber cavities 204. A number of layers that are deposited over the membrane layer 110 can form the piezoelectric actuator assembly 210 above the pumping chamber layer 202. As shown in FIG. 2, the layers include a bottom electrode layer 212, a piezoelectric layer 214, and a top electrode layer 216. Each of these three layers can be patterned to define individual actuator units that include a top electrode, a bottom electrode, and piezoelectric element directly above each pumping chamber cavity 204. As shown in FIG. 2, the membrane layer 110 has been removed from within the sidewalls of the pumping chamber cavities 204, but still exists in the planar portions of the pumping chamber layer 202 outside of the pumping chamber cavities 204.

Although examples are described in terms of a process for making a piezoelectric actuator assembly for a fluid ejection system, the process can be used in making other MEMS devices that include membranes having curved features or arrays of curved features.

The use of terminology such as "front," "back," "top," "bottom," "over," "above," and "below" throughout the specification and claims is to illustrate the relative position or orientation of various components of the system. The use of such terminology does not imply a particular orientation of the structure. Similarly, the use of any horizontal or vertical terms to describe elements is in relation to the implementation described. In other implementations, the same or similar elements can be oriented other than horizontally or vertically as the case may be.

What is claimed is:

1. A process for making a membrane having curved features, comprising:
vacuum bonding a first surface of a first substrate to a first surface of a first membrane layer, the first surface of the first substrate having a plurality of cavities formed therein, the first membrane layer being an exposed layer of a second substrate, a second surface of the first membrane layer being attached to a handle layer of the second substrate, and the first surface of the first membrane layer seals the plurality of cavities to form a plurality of vacuum chambers at completion of the vacuum bonding;
removing the handle layer of the second substrate to expose the second surface of the first membrane layer;
exposing the second surface of the first membrane layer to a fluid pressure such that the first membrane layer bends in areas above the plurality of cavities and touches respective bottom surfaces of the plurality of cavities at a plurality of respective contact locations; and
annealing the first membrane layer and the first substrate to form bonds between the first membrane layer and the first substrate at the plurality of respective contact locations.

2. The process of claim 1, wherein vacuum bonding the first surface of the first substrate to the first surface of the first membrane layer further comprises:
forming a oxide or nitride layer on a silicon substrate; and
bonding an exposed surface of the oxide or nitride layer to the first surface of the first substrate in a vacuum environment.

3. The process of claim 1, further comprising:
forming the plurality of cavities in the first surface of the first substrate.

4. The process of claim 1, wherein exposing the second surface of the first membrane layer to a fluid pressure comprises:
exposing the second surface of the first membrane layer to an atmosphere pressure.

5. The process of claim 1, wherein the plurality of cavities have a depth of 5-15 microns.

6. The process of claim 1, wherein the plurality of cavities have respective lateral dimensions of 150-200 microns.

7. The process of claim 1, wherein the first membrane layer has a thickness of 1-2 microns.

8. The process of claim 1, further comprising:
selectively etching the first surface of the first substrate through a patterned photoresist layer to form the plurality of cavities, the patterned photoresist layer defining respective lateral dimensions and locations of the plurality of cavities; and
removing the patterned photoresist layer from the first surface of the first substrate after the plurality of cavities reach a predetermined depth.

9. The process of claim 8, wherein the selective etching is dry etching.

10. The process of claim 8, wherein the respective bottom surfaces of the plurality of cavities are sufficiently smooth to enable bonding with another substrate.

11. The process of claim 1, further comprising:
depositing a second membrane layer over the second surface of the first membrane layer, such that the second membrane layer conforms to the second surface of the first membrane layer and includes a plurality of curved portions in the areas above the plurality of cavities.

12. The process of claim 11, wherein the depositing is performed after the annealing.

13. The process of claim 11, wherein:
the second membrane layer includes multiple sub-layers, and
depositing the second membrane layer comprises sequentially depositing each of the multiple sub-layers over the second surface of the first membrane layer.

14. The process of claim 13, wherein the sub-layers include at least a reference electrode layer, a sputtered piezoelectric layer, and a drive electrode layer.

15. The process of claim 11, further comprising:
after the second membrane layer is deposited, removing the bottom surfaces of the plurality of cavities to open the plurality of vacuum chambers and expose the first surface of the first membrane layer in areas within respective sidewalls of the plurality of cavities.

16. The process of claim 15, wherein removing the bottom surfaces of the plurality of cavities further comprises:
etching a second surface of the first substrate in at least the areas within the respective sidewalls of the plurality of cavities such that the plurality of vacuum chambers are opened and that the first surface of the first membrane layer are exposed in the areas within the respective sidewalls of the plurality of cavities, where exposed first surface of the first membrane layer serves as an etch stop for the etching.

17. The process of claim 15, further comprising:
removing the first membrane layer in the areas within the sidewalls of the plurality of cavities to expose the curved portions of the second membrane layer, while the curved portions of the second membrane layer remain curved during and after the removal of the first membrane layer.

18. The process of claim 17, wherein removing the first membrane layer in the areas within the respective sidewalls of the plurality of cavities further comprises:
etching the first membrane layer in the areas within the respective sidewalls of the plurality of cavities to expose the curved portions of the second membrane layer, where the exposed curved portions of the second membrane layer serves as an etch stop and the first substrate serves as a mask for the etching.

19. A process for making a membrane having a curved feature, comprising:
vacuum bonding a first surface of a first substrate to a first surface of a first membrane layer, the first surface of the first substrate having a cavity formed therein, the first membrane layer being an exposed layer of a second substrate, a second surface of the first membrane layer being attached to a handle layer of the second substrate, and the first surface of the first membrane layer seals the cavity to form a vacuum chamber at completion of the vacuum bonding;
removing the handle layer of the second substrate to expose the second surface of the first membrane layer;
exposing the second surface of the first membrane layer to a fluid pressure such that the first membrane layer bends in an area above the cavity and touches a bottom surface of the cavity at a contact location;

annealing the first membrane layer and the first substrate to form a bond between the first membrane layer and the first substrate at the contact location;

depositing a second membrane layer over the second surface of the first membrane layer, such that the second membrane layer conforms to the second surface of the first membrane layer and includes a curved portion in the area above the cavity; and after the second membrane layer is deposited, removing the bottom surface of the cavity to open the vacuum chamber and expose the first surface of the first membrane layer in an area within sidewalls of the cavity.

20. A process for making a membrane having a curved feature, comprising:

vacuum bonding a first surface of a first substrate to a first surface of a first membrane layer, the first surface of the first substrate including a cavity formed therein; the first membrane layer being an exposed layer of a second substrate, a second surface of the first membrane layer being attached to a handle layer of the second substrate, and the first surface of the first membrane layer seals the cavity to form a vacuum chamber at completion of the vacuum bonding;

removing the handle layer of the second substrate to expose the second surface of the first membrane layer;

exposing the second surface of the first membrane layer to a fluid pressure such that the first membrane layer bends in an area above the cavity;

depositing a second membrane layer over the second surface of the first membrane layer while the second surface of the first membrane layer is exposed to the fluid pressure, such that the second membrane layer conforms to the second surface of the first membrane layer and includes a curved portion in the area above the cavity; and after the second membrane layer is deposited, removing the bottom surface of the cavity to open the vacuum chamber and expose the first surface of the first membrane layer in an area within sidewalls of the cavity.

21. The process of claim 20, wherein removing the bottom surface of the cavity further comprises:

etching a second surface of the first substrate in at least the area within the sidewalls of the cavity such that the vacuum chamber is opened and that the first surface of the first membrane layer is exposed in the area within the sidewalls of the cavity, where exposed first surface of the first membrane layer serves as an etch stop for the etching.

22. The process of claim 20, further comprising:

removing the first membrane layer in the area within the sidewalls of the cavity to expose the curved portion of the second membrane layer, while the curved portion of the second membrane layer remains curved during and after the removal of the first membrane layer.

23. The process of claim 22, wherein removing the first membrane layer in the area within the sidewalls of the plurality of cavities further comprises:

etching the first membrane layer in the area within the sidewalls of the cavity to expose the curved portion of the second membrane layer, where the exposed curved portion of the second membrane layer serves as an etch stop and the first substrate serves as a mask for the etching.

* * * * *